(12) United States Patent
Jang et al.

(10) Patent No.: US 11,107,841 B2
(45) Date of Patent: Aug. 31, 2021

(54) DISPLAY PANEL AND LARGE FORMAT DISPLAY APPARATUS USING THE SAME

(71) Applicant: SAMSUNG ELECTRONICS CO., LTD., Suwon-si (KR)

(72) Inventors: Kyungwoon Jang, Suwon-si (KR); Wonsoon Park, Suwon-si (KR); Dongmyung Son, Suwon-si (KR); Sangmin Shin, Suwon-si (KR); Changjoon Lee, Suwon-si (KR); Youngki Jung, Suwon-si (KR); Seongphil Cho, Suwon-si (KR); Gyun Heo, Suwon-si (KR); Soonmin Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 15 days.

(21) Appl. No.: 16/503,035

(22) Filed: Jul. 3, 2019

(65) Prior Publication Data
US 2020/0013803 A1     Jan. 9, 2020

(30) Foreign Application Priority Data

Jul. 4, 2018   (KR) .................. 10-2018-0077668
Jun. 25, 2019  (KR) .................. 10-2019-0075904

(51) Int. Cl.
*H01L 27/12*   (2006.01)
*H01L 25/16*   (2006.01)

(52) U.S. Cl.
CPC .......... *H01L 27/124* (2013.01); *H01L 25/167* (2013.01)

(58) Field of Classification Search
CPC . H01L 27/124; H01L 25/167; H01L 25/0753; H01L 33/62; H01L 51/0036; H01L 27/32–3293; H01L 27/1214–1296; H01L 27/3244–3279; H01L 2021/775; G09G 3/2092; G09G 5/14; G09G 3/36
See application file for complete search history.

(56) References Cited

U.S. PATENT DOCUMENTS 6,456,354 B2    9/2002   Greene et al.
9,367,094 B2    6/2016   Bibl et al.
(Continued)

FOREIGN PATENT DOCUMENTS

EP    2 426 718 A1    3/2012
EP    3 316 302 A1    5/2018
(Continued)

OTHER PUBLICATIONS

International Search Report dated Oct. 16, 2019 issued by the International Searching Authority in counterpart International Application No. PCT/KR2019/008230 (PCT/ISA/210).
(Continued)

*Primary Examiner* — Cuong B Nguyen
(74) *Attorney, Agent, or Firm* — Sughrue Mion, PLLC

(57) ABSTRACT

A display panel is provided. The display panel according to an embodiment includes a thin film transistor glass substrate, a plurality of micro light emitting diodes (LEDs) arranged on one surface of the thin film transistor glass substrate, and a plurality of side wirings formed at an edge of the thin film transistor glass substrate to electrically connect the one surface of the thin film transistor glass substrate to an opposite surface to the one surface.

12 Claims, 30 Drawing Sheets

(56) References Cited

U.S. PATENT DOCUMENTS

| | | |
|---|---|---|
| 2001/0046007 A1 | 11/2001 | Greene et al. |
| 2015/0029684 A1 | 1/2015 | Park et al. |
| 2015/0282293 A1 | 10/2015 | Lim et al. |
| 2017/0040306 A1 | 2/2017 | Kim et al. |
| 2017/0148374 A1 | 5/2017 | Lee et al. |
| 2017/0286044 A1 | 10/2017 | Kim et al. |
| 2018/0190631 A1* | 7/2018 | Kim .................... G02F 1/13336 |

FOREIGN PATENT DOCUMENTS

| | | |
|---|---|---|
| JP | 2003-506757 A | 2/2003 |
| JP | 5341982 B2 | 11/2013 |
| JP | 2015-175969 A | 10/2015 |
| KR | 10-2011-0055089 A | 5/2011 |
| KR | 10-2013-0076599 A | 7/2013 |
| KR | 10-2014-0136233 A | 11/2014 |
| KR | 10-2015-0110910 A | 10/2015 |
| KR | 10-1567929 B1 | 11/2015 |
| KR | 10-1606818 B1 | 3/2016 |
| KR | 10-2017-0059523 A | 5/2017 |
| KR | 10-2017-0073401 A | 6/2017 |
| KR | 10-2017-0080937 A | 7/2017 |
| KR | 10-2017-0125163 A | 11/2017 |
| KR | 10-2017-0125187 A | 11/2017 |
| KR | 10-2017-0135468 A | 12/2017 |
| KR | 10-2019-0070038 A | 6/2019 |

OTHER PUBLICATIONS

Written Opinion dated Oct. 16, 2019 issued by the International Searching Authority in counterpart International Application No. PCT/KR2019/008230 (PCT/ISA/237).

Communication dated Dec. 16, 2019 issued by the Korean Intellectual Property Office in counterpart Korean Application No. 10-2019-0075904.

Communication dated May 18, 2021, issued by the European Patent Office in European Application No. 19829907.5.

* cited by examiner (a)

(b)

(a)

(b)

(a)

(b)

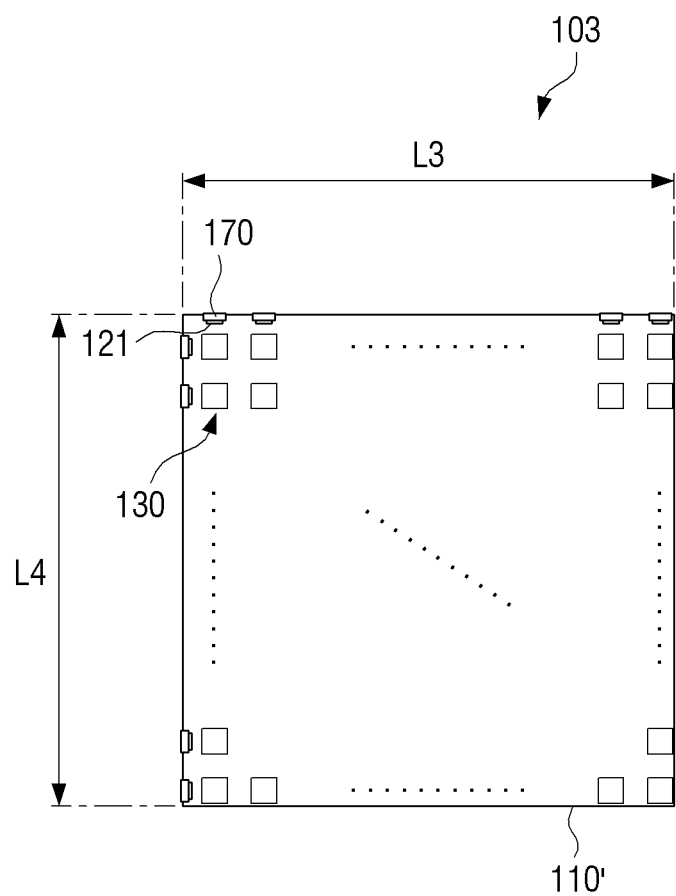

DISPLAY PANEL AND LARGE FORMAT DISPLAY APPARATUS USING THE SAME

CROSS-REFERENCE TO RELATED APPLICATIONS

This application is based on and claims priority under 35 U.S.C. § 119 to Korean Patent Application No. 10-2018-0077668, filed on Jul. 4, 2018, and Korean Patent Application No. 10-2019-0075904, filed on Jun. 25, 2019, in the Korean Intellectual Property Office, the disclosure of which is incorporated by reference herein in its entirety.

BACKGROUND

1. Field

Devices and methods consistent with what is disclosed herein relate to a display panel and a large format display apparatus using the same, and more particularly, to a display panel for realizing a bezel-less panel by arranging a side wiring structure at an edge of a TFT substrate for moving a bonding area of a driving circuit to a rear surface of the TFT substrate, and a large format display apparatus using the same.

2. Description of the Related Art

A display apparatus displays a variety of colors while operating on a pixel basis or on a sub-pixel basis and the operation thereof is controlled by each pixel or a sub-pixel Thin Film Transistor (TFT). A plurality of TFTs may be disposed on a flexible substrate, a glass substrate, or a plastic substrate, which may be generally referred to as a TFT substrate.

Such TFT substrate has been used for driving a display, such as a flexible device, a small-size wearable device (e.g., a wearable watch, etc.), a large-sized TV, and etc. For driving the TFT substrate, the TFT substrate is connected to an external circuit, such as external IC, to apply a current to the TFT substrate, or a driver circuit, for example, driver IC. Generally, the TFT substrate and each circuit may be connected through Chip on Glass (COG) bonding or Film on Glass (FOG) bonding. For these connections, a bezel area having a certain area needs to be provided at the edge of the TFT substrate.

Recently, study and research on a bezel-less technology for removing or reducing a bezel area to maximize a display area of a display panel, i.e. an active area, has been steadily performed, for example, a display panel disclosed in the US patent publication No. U.S. Pat. No. 9,367,094 (the publication date: Jun. 14, 2016). Currently, a bezel-less display panel has been applied to a small-sized display apparatus, such as a smartphone, or a large-sized display apparatus, such as a display board.

SUMMARY

Provided is a display panel for realizing a bezel-less panel by arranging a side wiring structure at an edge of a TFT substrate for moving a bonding area of a driving circuit to a rear surface of the TFT substrate and a large format display apparatus using the same.

Further, provided is a display apparatus using µ-LED, providing a display panel with increased mounting density of µ-LED by arranging a side wiring connecting a TFT substrate to a driving circuit on the outside of µ-LED mounting surface in mounting a plurality of µ-LEDs on the TFT substrate, and a large format display apparatus using the same.

Further still, provided is a display apparatus, in the case of large format display (LFD) fabricated by connecting a plurality of bezel-less display panels, providing a display panel for preventing seam from appearing in advance between display panels by maintaining a pitch between outermost pixels of display panels adjacent to each other to be the same as a pitch of a single display and a large format display apparatus using the same.

In accordance with an aspect of the disclosure, there is provided a display panel including a thin film transistor glass substrate, a plurality of micro light emitting diodes (LEDs) arranged on one surface of the thin film transistor glass substrate, and a plurality of side wirings formed at an edge of the thin film transistor glass substrate to electrically connect the one surface of the thin film transistor glass substrate to an opposite surface to the one surface.

The display panel may include each of the plurality of side wirings being connected to the one surface, a side end surface, and the opposite surface to the one surface of the thin film transistor glass substrate.

The display panel may include both ends of each of the plurality of side wirings being electrically connected to a first connection pad and a second connection pad formed at the edge of the thin film transistor glass substrate, respectively.

The display panel may include the edge of the thin film transistor glass substrate corresponding to a dummy area not including an active area where the plurality of micro LEDs are arranged on the thin film transistor glass substrate.

The display panel may include the edge of the thin film transistor glass substrate being an area from an outermost portion of the thin film transistor glass substrate to the active area.

The display panel may include the plurality of side wirings that are formed on a side end surface of the thin film transistor glass substrate at a predetermined interval.

The display panel may include the plurality of side wirings that are disposed on a plurality of grooves formed on the side end surface of the thin film transistor glass substrate.

The display panel may include the plurality of side wirings that are disposed on a side end surface of the thin film transistor glass substrate.

The display panel may include the plurality of side wirings that are formed inwardly from the side end surface of the thin film transistor glass substrate.

The display panel may include both ends of each of the plurality of side wirings being electrically connected to a first connection pad and a second connection pad formed at the edge of the thin film transistor glass substrate, respectively.

The display panel may include both ends of each side wiring covering the first connection pad and the second connection pad.

The display panel may include a protective layer for covering the plurality of side wirings formed at the edge of the thin film transistor glass substrate.

The display panel may include the protective layer being formed of an insulating material.

In accordance with another aspect of the disclosure, there is provided a large format display apparatus manufactured by connecting a plurality of display panels, each of the plurality of display panels including a thin film transistor glass substrate, a plurality of micro light emitting diodes (LEDs) arranged on one surface of the thin film transistor glass substrate, and a plurality of side wirings formed at an edge of the thin film transistor glass substrate to electrically connect the one surface of the thin film transistor glass substrate to an opposite surface to the one surface, wherein three micro LEDs constitute one pixel, a plurality of pixels provided in each of the plurality of display panels are arranged at a first pitch, and pixels of adjacent display panels among pixels of the plurality of display panels are arranged at a second pitch that is equal to the first pitch.

The display panel may include the plurality of side wirings being formed on the side end surface of the thin film transistor glass substrate so that the plurality of side wirings does not protrude from the side end surface of the thin film transistor glass substrate.

The display panel may include the first connection pad and the second connection pad that are formed closer to a side end surface of the thin film transistor glass substrate.

According to the above and other aspects, features, and advantages of certain embodiments of the present disclosure, a wire for electrically connecting a front surface of a TFT substrate to a back surface of the TFT substrate may be formed at the edge of the TFT substrate. Therefore, a dummy area of the TFT substrate may be minimized to easily realize a bezel-less display panel.

When a large format display apparatus is embodied by connecting a plurality of bezel-less display panels, the seam may not be obvious at the connection portion between display panels, thereby improving the display quality.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 9C is a front view illustrating a display panel according to yet another embodiment of the disclosure;

DETAILED DESCRIPTION

Figure 1A:
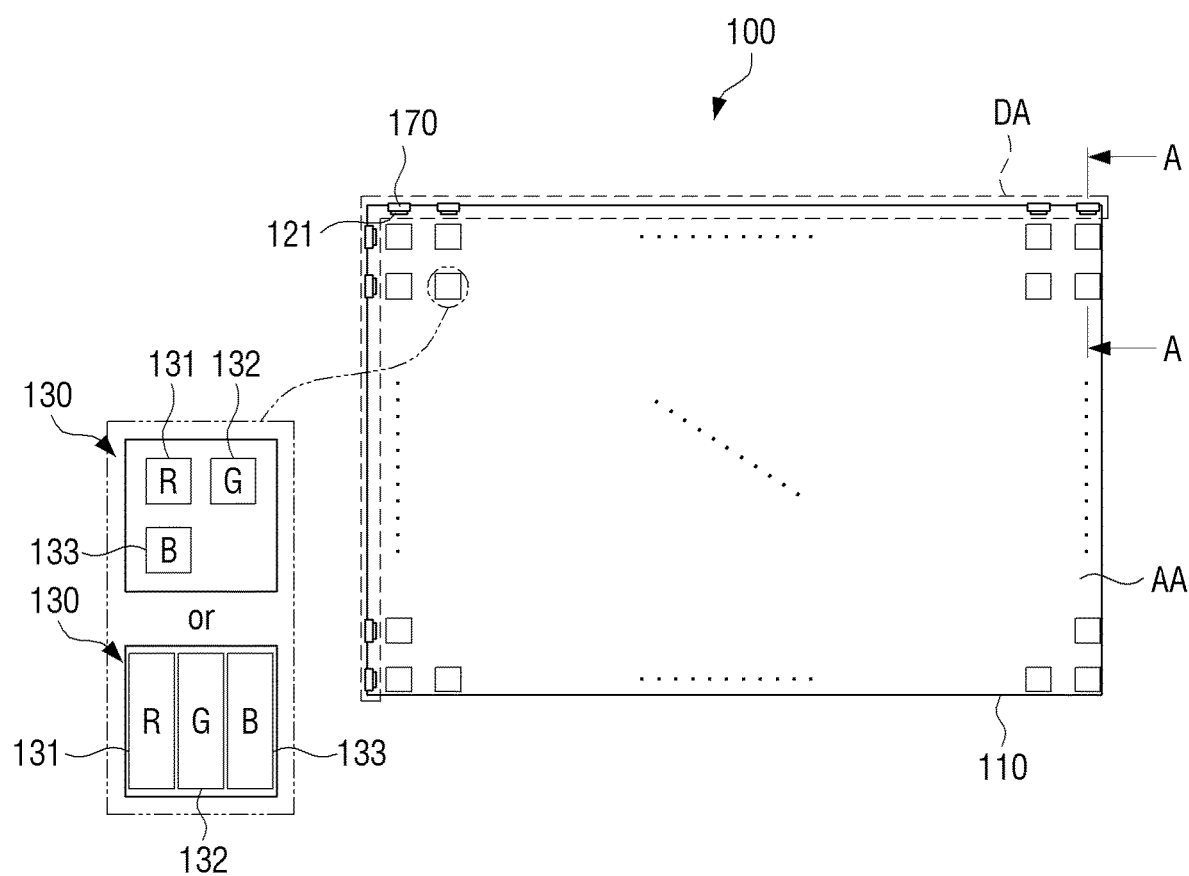
FIG. 1A is a front view illustrating a display panel according to an embodiment.

Embodiments described in the present disclosure may omit detailed description of relevant known functions or components to prevent any obscure description of the subject matter. In addition, the redundant description of the same components will be omitted.

Further, the suffix "part" for the constituent elements used in the present disclosure may be given or mixed in consideration for the ease of description, and may not have a specific meaning or may have a role to distinguishes itself.

The terms used in the application are merely used to describe particular embodiments, and are not intended to limit the disclosure. Singular forms in the disclosure are intended to include the plural forms as well, unless the context clearly indicates otherwise.

The singular expression may also include the plural meaning as long as it does not include different meaning in the context. In the present disclosure, terms such as 'include' and 'have/has' may be construed as designating features, numbers, operations, elements, components or a combination thereof in the present disclosure, not to exclude the existence or possibility of adding one or more of other features, numbers, operations, elements, components or a combination thereof.

Terms such as 'first' and 'second' may be used to modify various elements regardless of order and/or importance. These terms may be used for the purpose of differentiating a component from other components.

When an element (e.g., a first constituent element) is referred to as being "operatively or communicatively coupled to" or "connected to" another element (e.g., a second constituent element), it should be understood that each constituent element may be directly connected or indirectly connected via another constituent element (e.g., a third constituent element). However, when an element is referred to as being "directly coupled to" or "directly connected to" another element, it should be understood that there may be no other constituent element (e.g., a third constituent element) interposed therebetween.

A display panel according to an embodiment may form a side wiring at the edge of a TFT glass substrate, and electrically connect a plurality of light emitting elements disposed on a front surface of a TFT substrate to circuits disposed on a back surface of the TFT substrate. The TFT substrate may include a glass substrate, a flexible substrate, or a plastic substrate, and a plurality of TFTs formed on one surface of the substrate may be referred to as a backplane. The glass substrate (hereinafter, referred to as 'TFT substrate') may be used for the purpose of the description herein.

The edge of the TFT substrate may be the outermost of the TFT substrate. The edge of the TFT substrate may include a dummy area from the outermost of the TFT substrate to the active area where an image may be displayed. Therefore, the dummy area may include a side end surface of the TFT substrate, a part of the front surface and a back surface of the TFT substrate adjacent to the side end surface.

The light emitting element may be micro Light Emitting Diode (µ-LED), and in this case, each µ-LED may include Red (R) color sub-pixel, Green (G) color sub-pixel, and Blue (B) color sub-pixel. A single pixel may include three sub-pixels of R, G and B, and each TFT of the TFT substrate may be formed on a sub-pixel basis.

The µ-LED may emit light by itself, and may exclude a backlight unit, a liquid crystal layer, and a polarizer, and also very thin glass layer that may be arranged on its top layer. Therefore, µ-LED may be formed in a thickness thinner than Organic Light Emitting diode (OLED).

The µ-LED may use an inorganic material, and thus a burn-in phenomenon may not occur. Therefore, the µ-LED may have three times higher luminance efficiency and half of power consumption than OLED using an organic material. Therefore, when the µ-LED-mounted display panel is applied to a smart phone, a user may clearly see the screen of the smart phone in a bright space, and the battery may run longer.

The µ-LED may be mounted on a substrate having a curvature through a roller transfer method, and an element may be attached to a substrate that may be stretched like rubber. As such, it becomes possible to manufacture a transparent display that may be freely transformed. This means that there is no limitation to a substrate to which the µ-LED is mounted practically.

The µ-LED may be manufactured to be in a ultra-small size of less than 100 um, and when it is applied to a wearable device, such as a smart watch, etc., a ultra-high resolution may be realized. The transition time of the µ-LED, which is the time taken for completely changing a color, that can realize the ultra-high resolution may be nano-seconds. For example, when the µ-LED is applied to Virtual Reality (VR) or Augmented Reality (AR) headset, the image quality may be significantly improved.

The side wiring disposed on the edge of the TFT substrate may electrically connect a first connection pad provided on the front surface of the TFT substrate to a second connection pad provided on the back surface of the TFT substrate. The side wiring may be formed along the front surface, the side end surface, and the back surface of the TFT substrate, and one end thereof may be electrically connected to the first connection pad, and the other end thereof may be electrically connected to the second connection pad. A part of the side wiring may be formed on the side end surface of the TFT substrate to protrude from the side end surface of the TFT substrate by the thickness of the side wiring.

The side wiring formed at the edge of the TFT substrate may be formed in the direction from the side end surface of the TFT substrate to the inside of the TFT substrate not to protrude from the side end surface of the TFT substrate. A part of the side wiring passing the side end surface of the TFT substrate may be formed in a groove provided on the side end surface of the TFT substrate. The part of the side wiring may completely fill the groove, or may be coated along an inner circumferential surface of the groove in a predetermined thickness. When the part of the side wiring fills the groove completely, the surface of the part of the side wiring may be positioned on the same surface of the side end surface of the TFT substrate. In addition, when the part of the side wiring is coated along the inner circumferential surface of the groove in a predetermined thickness, the surface of the part of the side wiring may be positioned inwardly to the TFT substrate rather than to the side end surface of the TFT substrate.

As described above, the display panel according to the above embodiments may realize a bezel-less display panel by minimizing a dummy area on the front area of the TFT substrate, and maximizing the active area.

In the structure for embodying the bezel-less display panel, the dummy area may be reduced, and the active area may be relatively increased. Therefore, the mounting density of the µ-LED for a unit display panel may be increased.

When a plurality of bezel-less display panels are connected, a large format display apparatus (LFD) that can maximize the active area may be provided. In this case, the display panel may be formed to maintain the pitch between pixels of display panels adjacent to each other to be the same as the pitch between pixels in a single display panel by minimizing the dummy area. Accordingly, the seam may be prevented from appearing in the connection portion between display panels.

Hereinafter, various embodiments of the disclosure will be described with reference to accompanying drawings.

Figure 1B:
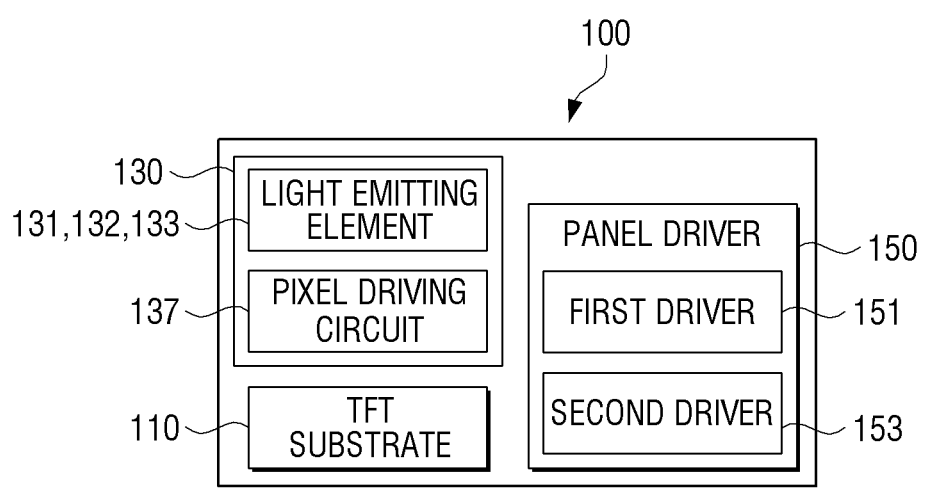
FIG. 1B is a block diagram to explain a display panel according to an embodiment.
Figure 2:
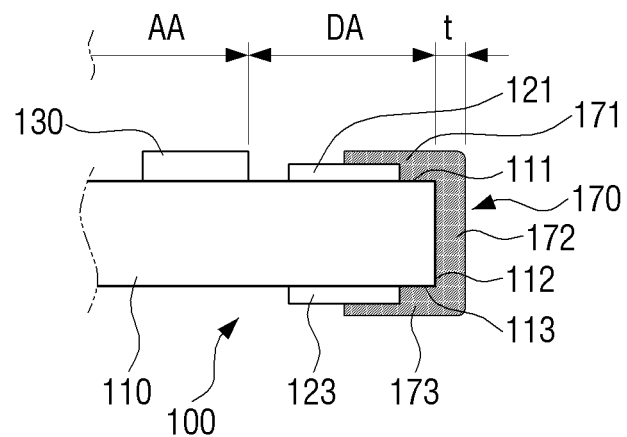
FIG. 2 is a cross-sectional view taken along line A-A shown in FIG. 1A according to an embodiment.

FIG. 1A is a front view illustrating a display panel according to an embodiment, FIG. 1B is a block diagram illustrating a display panel according to an embodiment, and FIG. 2 is a cross-sectional view taken along line A-A shown in FIG. 1A.

A display panel 100 according to an embodiment may include a TFT substrate 110 in which a plurality of pixel driving circuits 137 may be formed, a plurality of pixels 130 arranged on a front surface of the TFT substrate, a panel driver 150 for generating a control signal and providing the generated control signal to each pixel driving circuit 137 formed on the TFT substrate, a side wiring 170 formed at the edge of the TFT substrate 110 to electrically connect the pixel driving circuit 137 to the panel driver 150.

Referring to FIGS. 1A, 1B and 2, a plurality of data signal lines disposed on a horizontal direction for controlling the plurality of pixels 130 arranged on a front surface 111 of the TFT substrate, and a plurality of gate signal lines disposed in a vertical direction may be formed on the TFT substrate 110.

The front surface 111 of the TFT substrate may include an active area (AA) in which an image is displayed through the plurality of pixels 130, and a dummy area (DA) not including the active area. The dummy area DA may correspond to the edge of the TFT substrate 110, and in this disclosure, the dummy area and the edge of the TFT substrate 110 may be considered the same.

Referring to FIG. 1A, the plurality of pixels 130 may be arranged on the front surface of the TFT substrate 110 in a matrix formation. Each pixel 130 may include three subpixels R 131, G 132 and B 133 corresponding to red, green and blue colors, respectively. Each of the sub-pixels 131,132 and 133 may include micro Light Emitting Diode (µ-LED) that emits light of the color of the sub-pixel. In this disclosure, the sub-pixel and µ-LED may be considered the same.

The R, G and B sub-pixels 131,132 and 133 may be arranged in the matrix formation in one of the plurality of pixels 130, or sequentially arranged. However, the arrangement of the R, G and B sub-pixels 131,132 and 133 is not limited thereto. The arrangement could vary in a unit of the pixel 130. Each pixel 130 may include a pixel driving circuit for driving µ-LED corresponding to each of R, G and B sub-pixels 131,132 and 133.

The one pixel 130 may include three pixel driving circuits 137 for driving each R, G and B sub-pixels 131,132 and 133, respectively.

The panel driver 150 may be connected to the TFT substrate 110 in a Chip on Class (COG) bonding method, or Film on Glass (FOG) bonding method. The panel driver 150 may drive the plurality of pixel driving circuits 137 and control the light emission of a plurality of µ-LEDs 131,132 and 133 electrically connected to the plurality of pixel driving circuits 137. The panel driver 150 may control the plurality of pixel driving circuits line by line through a first driver 151 and a second driver 153.

The first driver 131 may generate a control signal for sequentially controlling a plurality of horizontal lines formed on the front surface 111 of the TFT substrate line by line for each frame, and transmit the generated control signal to the pixel driving circuit connected to the line.

The first driver 131 may be referred to as a gate driver.

The second driver 153 may generate a control signal for sequentially controlling a plurality of vertical lines formed on the front surface 111 of the TFT substrate line by line for each frame, and transmit the generated control signal to the pixel driving circuit 137 connected to the line.

In addition, the second driver 153 may be referred to as a data driver.

The side wiring 170 may be provided in plural along the edge of the TFT substrate 110 at an interval. The side wiring 170 may electrically connect a first connection pad 121 formed on the front surface 111 of the TFT substrate to a second connection pad 123 formed on the back surface 113 of the TFT substrate. The first connection pad 121 may be provided in plural at a predetermined distance along the upper side of the front surface 111 of the TFT substrate and the left side of the front surface 111 of the TFT substrate. The plurality of first connection pads 121 arranged along the upper side of the front surface 111 of the TFT substrate may be electrically connected to the gate signal wire, and the plurality of first connection pads 121 arranged along the left side of the front surface 111 of the TFT substrate may be electrically connected to the data signal wire.

One end of the side wiring 170 may be electrically connected to the front pad, and the other end may be electrically connected to the back pad so that the first connection pad 121 of the front surface 111 of the TFT substrate and the second connection pad 123 of the back surface 113 of the TFT substrate may be electrically connected to each other.

Referring to FIG. 2, the side wiring 170 may include a first part 171 on the front surface 111 of the TFT substrate at the edge of the TFT substrate 110, a second part 172 formed on the side end surface 112 of the TFT substrate, and a third part 173 formed on the back surface 113 of the TFT substrate. In this case, the side wiring 170 may protrude from the side end surface 112 by a thickness of the side wiring 170 because the second part 172 is provided on the side end surface 112 of the TFT substrate.

In order to prevent disconnection of the second part 172 of the side wiring 170 protruding from the side end surface 112 of the TFT substrate, it also possible to stack an additional protective layer 180 (see FIG. 12) on the side wiring 170. The thickness of the protective layer 180 may be equal to or less than that of the side wiring 170.

Referring to FIG. 3 to FIG. 6, the side wiring 170 may be formed at the edge of the TFT substrate 110 through various processes. For ease of explanation, the plurality of pixels 130 arranged on the TFT substrate 110 will be omitted in FIG. 3 to FIG. 6.

Figure 3:
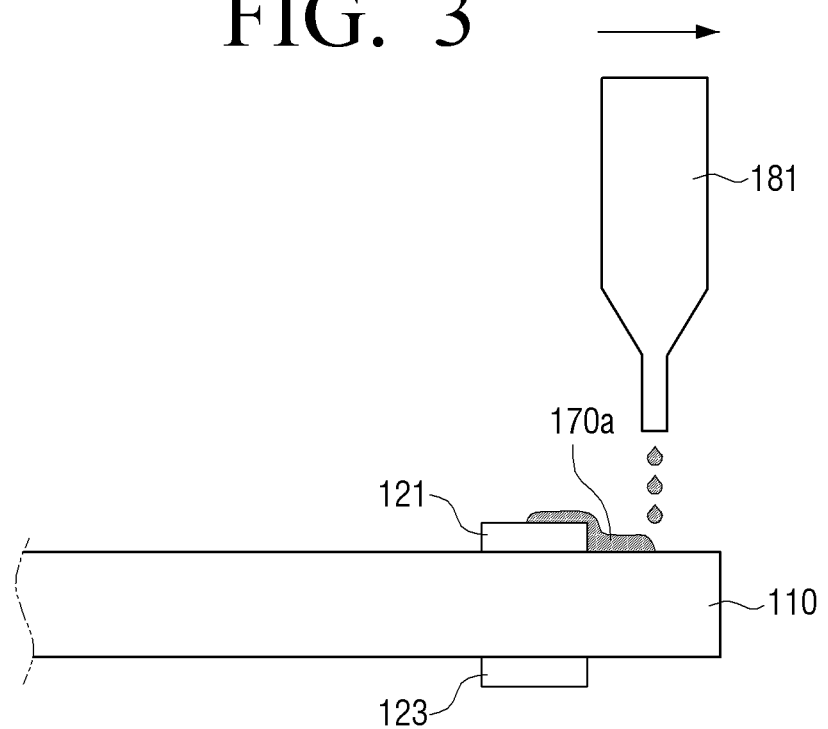
FIG. 3 is a schematic view illustrating a process of forming a side wiring by applying a conductive metal material on an edge of a TFT substrate through an inkjet method according to an embodiment.

FIG. 3 is a schematic view illustrating a process of forming a side wiring by applying a conductive metal material on an edge of a TFT substrate through an inkjet method.

Referring to FIG. 3, a side wiring may be formed to spray a conductive metal material 170a in ink form on the edge of the TFT substrate 110 using an inkjet method. The conductive metal material 170a may be sequentially applied to the front surface, the side end surface and the back surface of the TFT substrate 110 to form a side wiring.

Figure 4:
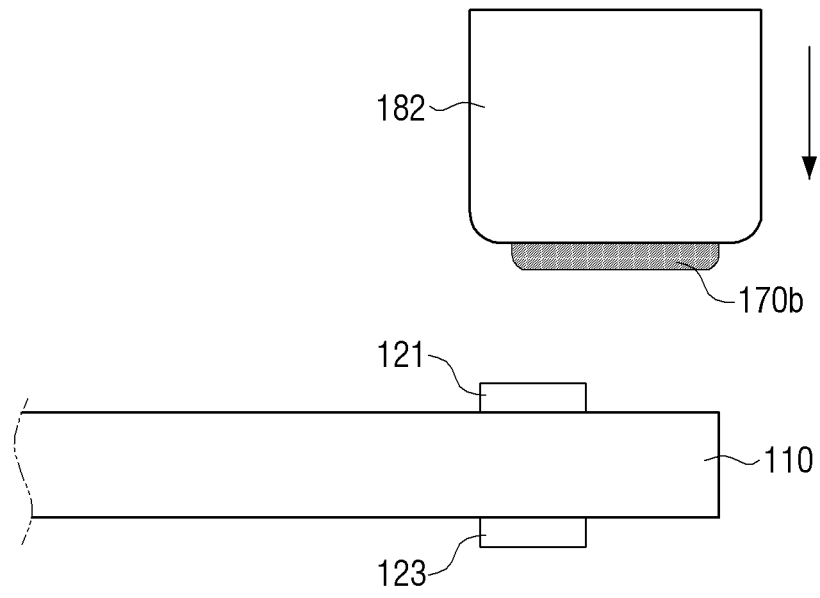
FIG. 4 is a schematic view illustrating a process of forming a side wiring by applying a conductive metal material on an edge of a TFT substrate through a stamping method according to an embodiment.
Figure 4:
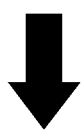
Figure 4:
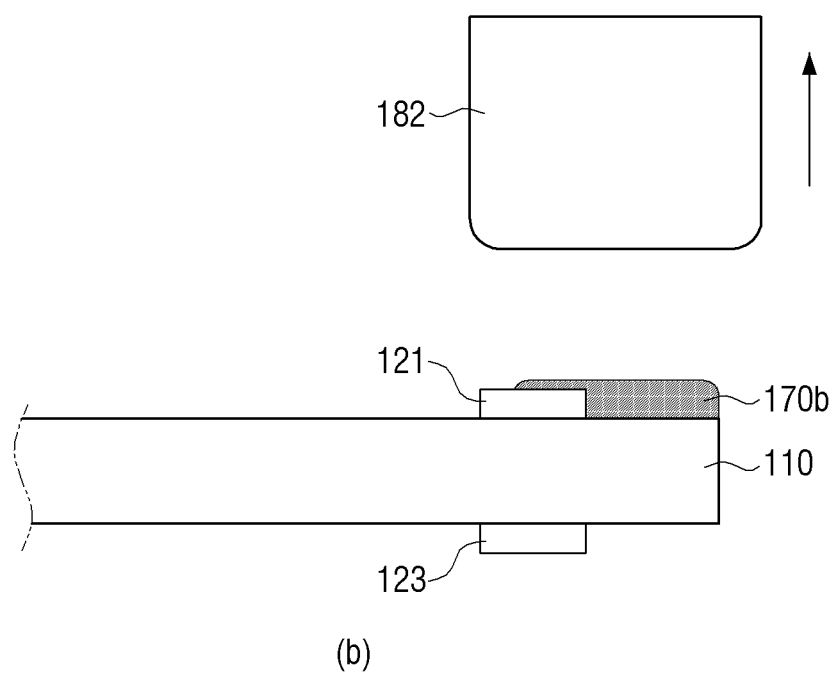

FIG. 4 is a schematic view illustrating a process of forming a side wiring by applying a conductive metal material on an edge of a TFT substrate through a stamping method.

Referring to FIG. 4, a conductive metal material 170b in paste form may be applied on the edge of the TFT substrate 110 through a movable member 182. For example, the conductive metal material 170b may be sequentially applied to the front surface, the side end surface, and the back surface of the TFT substrate 110 to form a side wiring.

Figure 5:
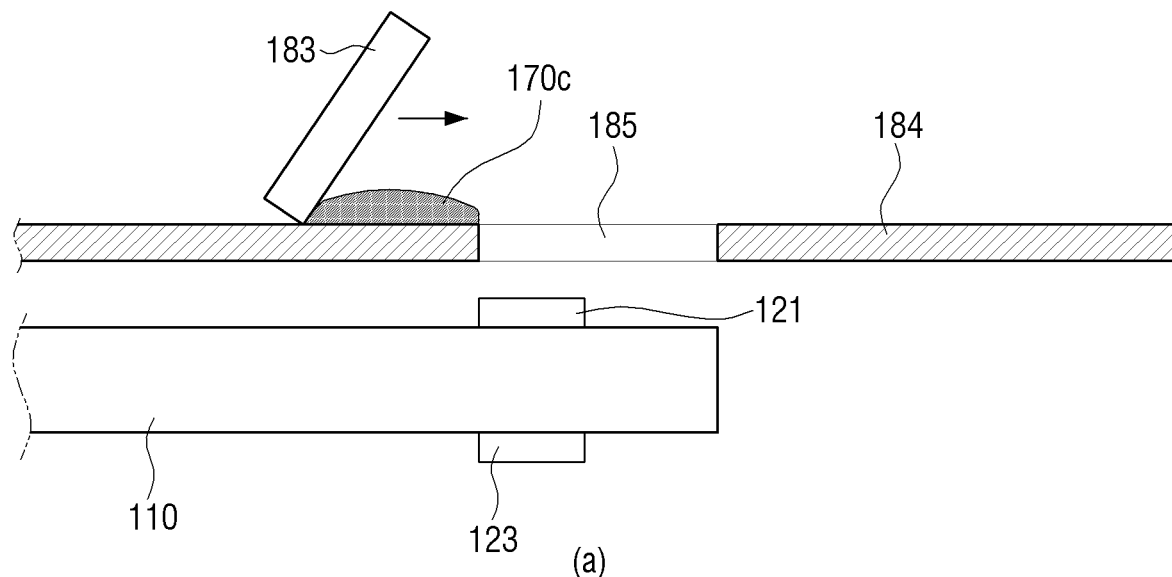
FIG. 5 is a schematic view illustrating a process of forming a side wiring by applying a conductive metal material on an edge of a TFT substrate through a screen printing method according to an embodiment.
Figure 5:
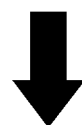
Figure 5:
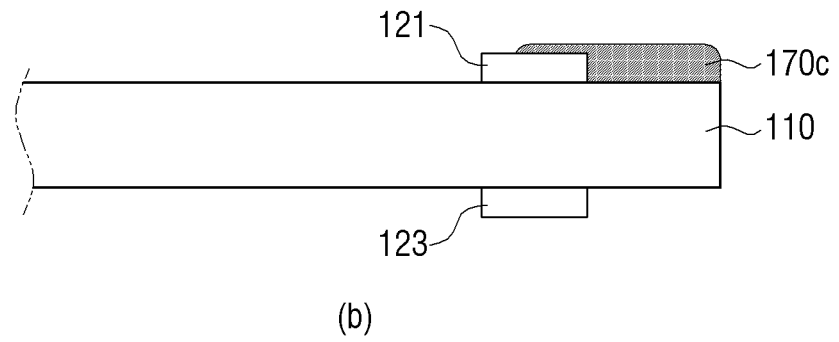

FIG. 5 is a schematic view illustrating a process of forming a side wiring by applying a conductive metal material on an edge of a TFT substrate through a screen printing method.

Referring to FIG. 5, a mask 184 may be disposed on the TFT substrate 110 such that a discharge hole 185 formed in the mask may correspond to the edge of the TFT substrate 110 in which a side wiring is formed. A conductive metal material 170c in paste form provided on the upper surface of the mask 184 may be pushed to a scraper 183 to be applied to the edge of the TFT substrate 110 through the discharge hole 185. The conductive metal material 170c may be sequentially applied to the front surface, the side end surface, and back surface of the edge of the TFT substrate 110.

Figure 6:
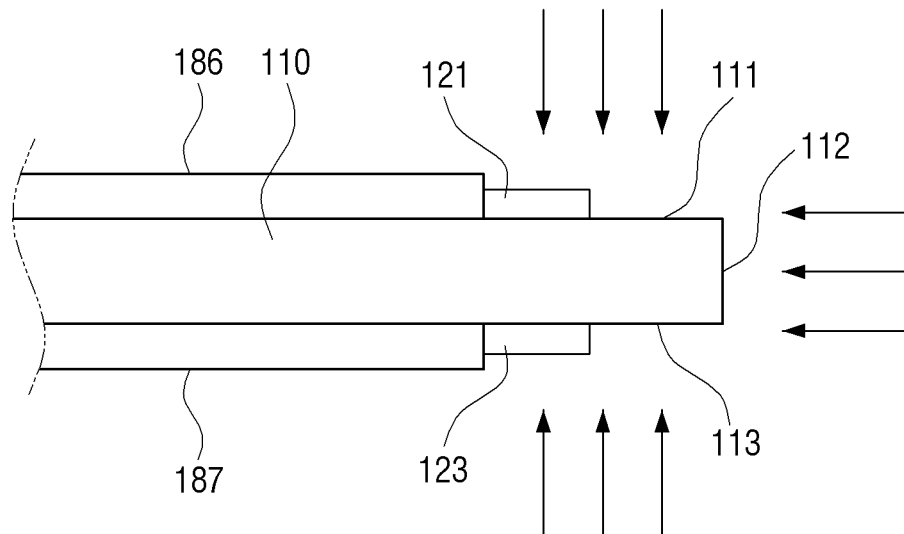
FIG. 6 is a schematic view illustrating a process of forming a side wiring by applying a conductive metal material on an edge of a TFT substrate through a metal deposition method according to an embodiment.
Figure 6:
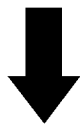
Figure 6:
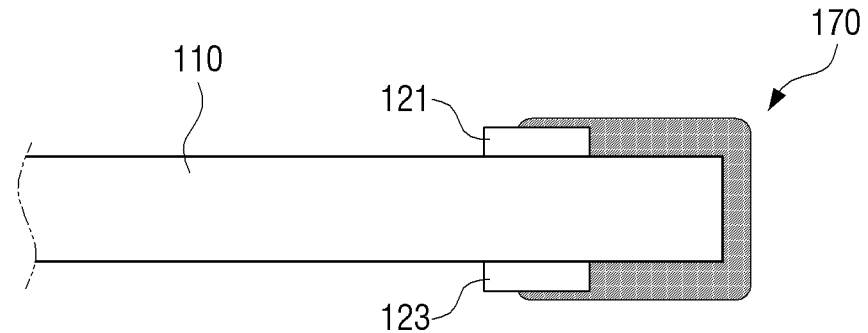

FIG. 6 is a schematic view illustrating a process of forming a side wiring by applying a conductive metal material on an edge of a TFT substrate through a metal deposition method.

The side wiring 170 may be formed on the edge of the TFT substrate 110 through a metal deposition method (e.g., sputter deposition methods). Masks 186 and 187 using tape or liquid resin may be formed on the TFT substrate 110 and a conductive metal material may be deposited so that the edge of the TFT substrate 110 may be exposed. Depending on the metal deposition equipment, the conductive metal material may be deposited on the front surface, the side end surface, and the back surface of the TFT substrate 110 simultaneously, or may be sequentially deposited on each surface.

Hereinafter, referring to FIGS. 7A, 7B, 7C, and 7D, an adhesive method for forming a side wiring 470 according to an embodiment of the disclosure will be described.

Figure 7A:
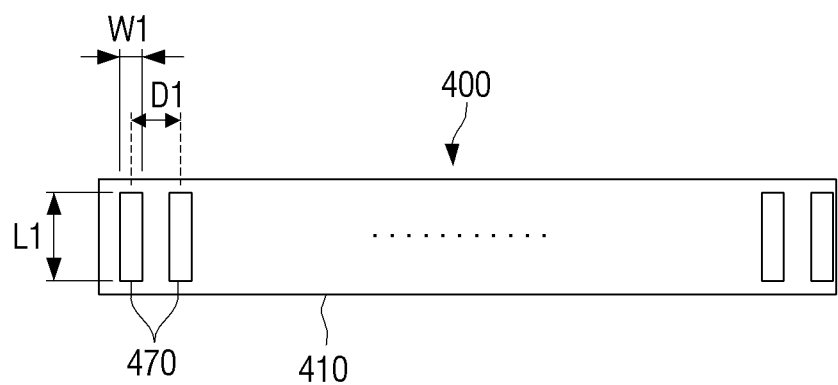
FIG. 7A is a top view illustrating an adhesive member according to an embodiment.
Figure 7B:
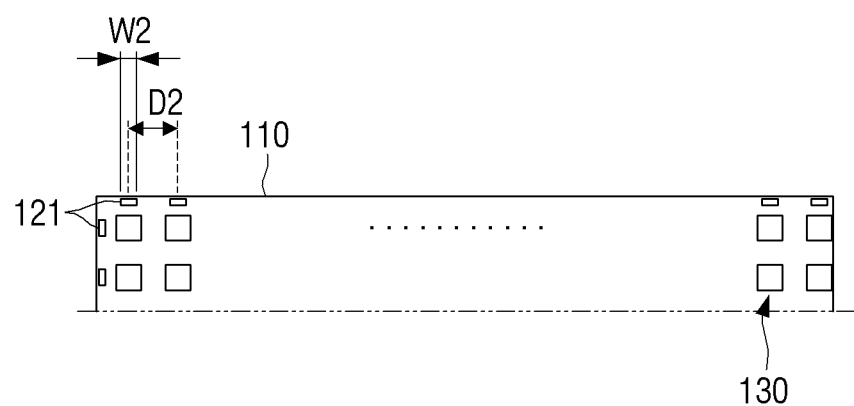
FIG. 7B is a schematic view illustrating a TFT substrate on which a plurality of side wirings are not formed according to an embodiment.
Figure 7C:
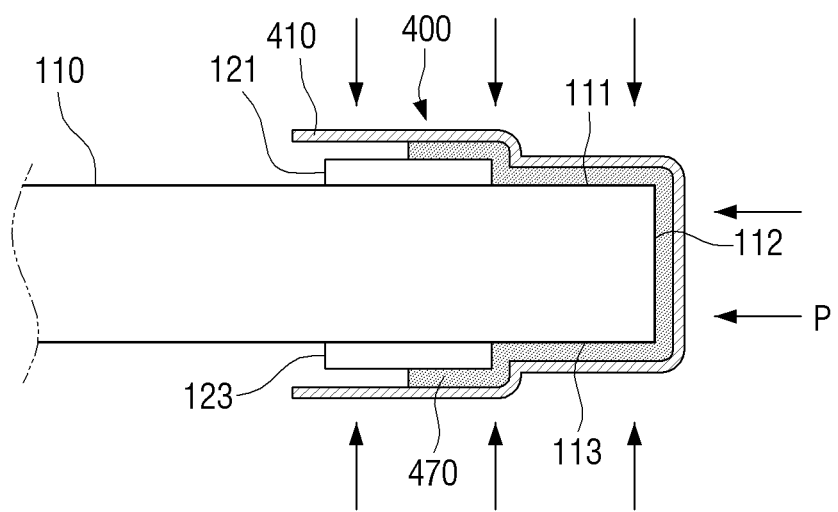
FIG. 7C is a schematic view illustrating a process for forming a side wiring on an edge portion of a TFT substrate through an adhesive method according to an embodiment.
Figure 7D:
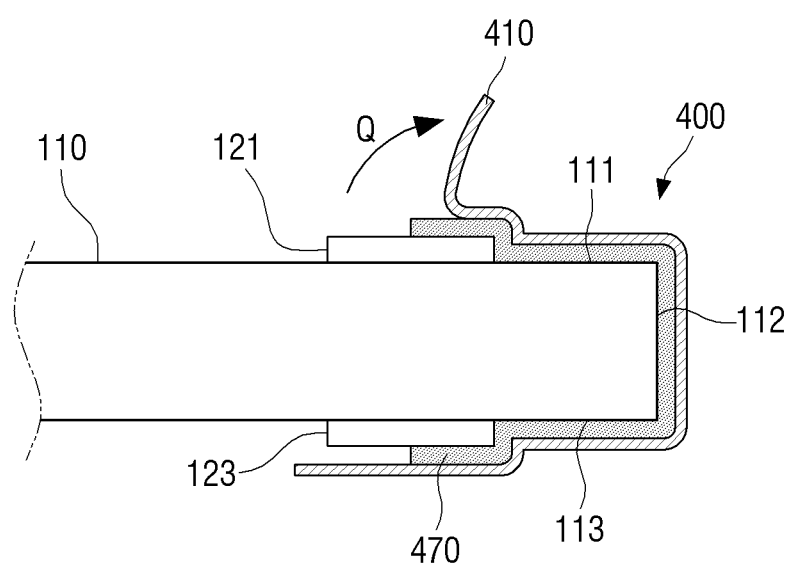
FIG. 7D is a schematic view illustrating a process of removing a tape according to an embodiment.

FIG. 7A is a front view illustrating an adhesive member, FIG. 7B is a schematic view illustrating a TFT substrate on which a plurality of side wirings are not formed, FIG. 7C is a schematic view illustrating a process for forming a side wiring on an edge portion of a TFT substrate through an adhesive method, and FIG. 7D is a schematic view illustrating a process of removing a tape.

Referring to FIG. 7A and FIG. 7B, an adhesive member 400 may include a tape 410 and a plurality of conductive members 470 formed on the tape 410.

The tape 410 may be formed of a material that may be bonded to the plurality of conductive members 470 disposed on one surface of the tape 410. In addition, the tape 410 may be formed of a material that loses adhesion when heat is applied.

Accordingly, when heat is applied to the tape 410, the plurality of conductive members 470 may be easily separated from the tape 410.

The plurality of conductive members 470 (or side wirings) may be formed of a conductive material. In addition, when the conductive members 470 are attached to the edge portion of the TFT substrate 110, the conductive members 470 may form a side wiring that electrically connect a first connection pad 121 to a second connection pad 123.

The conductive members 470 may be in a state before being adhered to the edge portion of the TFT substrate 110, and the side wiring 170 may be in a state after being adhered to the edge portion of the TFT substrate 110.

Each of the conductive members 470 may be in a square or rectangular shape having a first width W1 and a first length L1.

The first width W1 may correspond to a second width W2 of the first connection pad 121. For example, the first width W1 of the conductive member 470 may be determined based on the second width W2 of the first connection pad 121 electrically and physically connected to the conductive member 470.

To be specific, the first width W1 may be equal to or greater than the second width W2. The conductive member 470 may cover the first connection pad 121 to partially surround the first connection pad 121.

In addition, the first width W1 of the conductive member 470 may be determined based on the width of the second connection pad 123 as well as the first connection pad 121.

The first length L1 may be a length for connecting the first connection pad 121 to the second connection pad 123 while surrounding the edge portion of the TFT substrate 110.

For example, the first length L1 may be a distance from the first connection pad 121 to the second connection pad 123 including the front surface 111, the side end surface 112, and the back surface 113 of the TFT substrate.

In addition, the plurality of conductive members 470 may be arranged to be spaced apart from each other by a first interval D1 on the tape 410. The first interval D1 may be a distance between center lines of the plurality of conductive members 470, and may correspond to a second interval D2 which is a distance between center lines of the plurality of first connection pads 121.

Accordingly, one conductive member 470 may connect one first connection pad 121 to one second connection pad 123, which is disposed on the opposite side of the one first connection pad 121.

Referring to FIG. 7C, the adhesive member 400 may be bonded to the edge portion of the TFT substrate 110. One conductive member 470 may contact one first connection pad 121 disposed on the front surface 111 of the TFT substrate, the side end surface 112 of the TFT substrate, the back surface 113 of the TFT substrate, and the second connection pad 123.

Accordingly, the first connection pad 121 and the second connection pad 123 may be electrically connected.

A heat compression (P) may be applied to the adhesive member 400 while the adhesive member is bonded to the edge portion of the TFT substrate 110. Accordingly, the plurality of conductive members 470 may be bonded and fixed to the edge portion of the TFT substrate 110.

In other words, the plurality of conductive members 470 may be bonded to the edge portion of the TFT substrate 110 to form a plurality of side wirings.

Referring to FIG. 7D, the tape 410 may be removed from the plurality of conductive members 470.

Figure 8A:
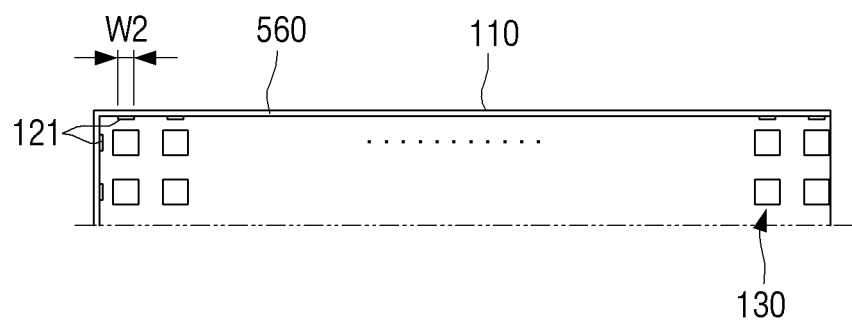
FIG. 8A is a schematic view illustrating a conductive layer formed on an edge portion of a TFT substrate according to an embodiment.
Figure 8B:
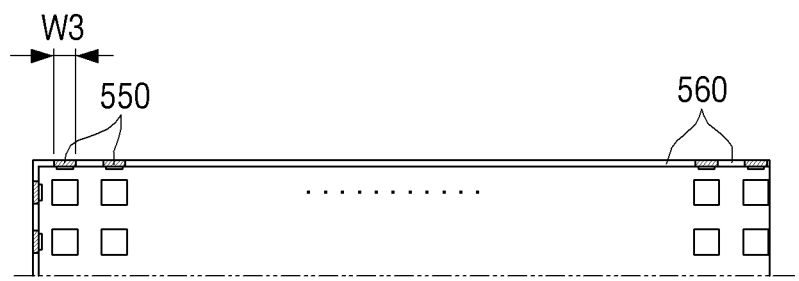
FIG. 8B is a schematic view illustrating a masking member formed on a conductive layer according to an embodiment.
Figure 8C:
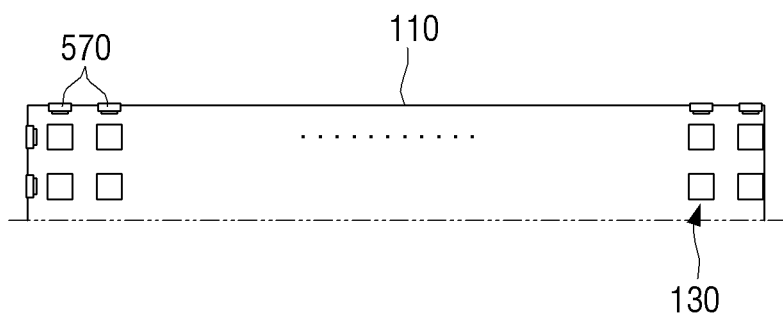
FIG. 8C is a schematic view illustrating an edge portion of a TFT substrate on which a plurality of side wirings are formed according to an embodiment.

Referring to FIGS. 8A, 8B and 8C, an etching method for forming the side wiring 570 according to an embodiment will be described.

FIG. 8A is a schematic view illustrating a conductive layer being formed on an edge portion of a TFT substrate, FIG. 8B is a schematic view illustrating a masking member being formed on a conductive layer, and FIG. 8C is a schematic view illustrating an edge portion of a TFT substrate on which a plurality of side wirings are formed.

Referring to FIG. 8A, the conductive layer 560 may be formed along the edge portion of the TFT substrate 110. The conductive layer 560 may be bonded to the first connection pad 121, the front surface 111 of the TFT substrate, the side end surface 112 of the TFT substrate, the back surface 113 of the TFT substrate and the second connection pad 123.

Referring to FIG. 8B, the masking member 550 may be formed at the edge portion of the TFT substrate 110 at a predetermined interval to correspond to a position in which the plurality of first connection pads 121 and the plurality of second connection pads 123 are disposed.

The masking member 550 may protect the conductive layer 560 disposed on an area in which the masking member 550 is formed not to be etched in the process of etching the conductive layer 560.

The masking member 550 may correspond to a shape of the plurality of side wirings 570 to be formed. For example, the third width W3 of the masking member 550 may correspond to the width of the plurality of side wirings 570 to be formed.

The third width W3 may be equal to or greater than the second width W2 of the first connection pad 121. The masking member 550 may partially cover the first connection pad 121.

The third width W3 of the masking member 550 may be determined based on the width of the second connection pad 123 as well as that of the first connection pad 121.

Referring to FIG. 8B, the etching process of the conductive layer 560 may be performed. The etching may include a wet etching and a dry etching.

For example, the conductive layer 560 disposed in an area in which the masking member 550 is formed may not be etched, and the conductive layer 560 disposed in an area in which the masking member 550 is not formed may be etched.

Accordingly, referring to FIG. 8C, the plurality of side wirings 570 may be formed to correspond to a position at which the first connection pad 121 and the second connection pad 123 are disposed.

The plurality of side wirings 570 may connect the first connection pad 121 to the second connection pad 123 electrically and physically.

Figure 9A:
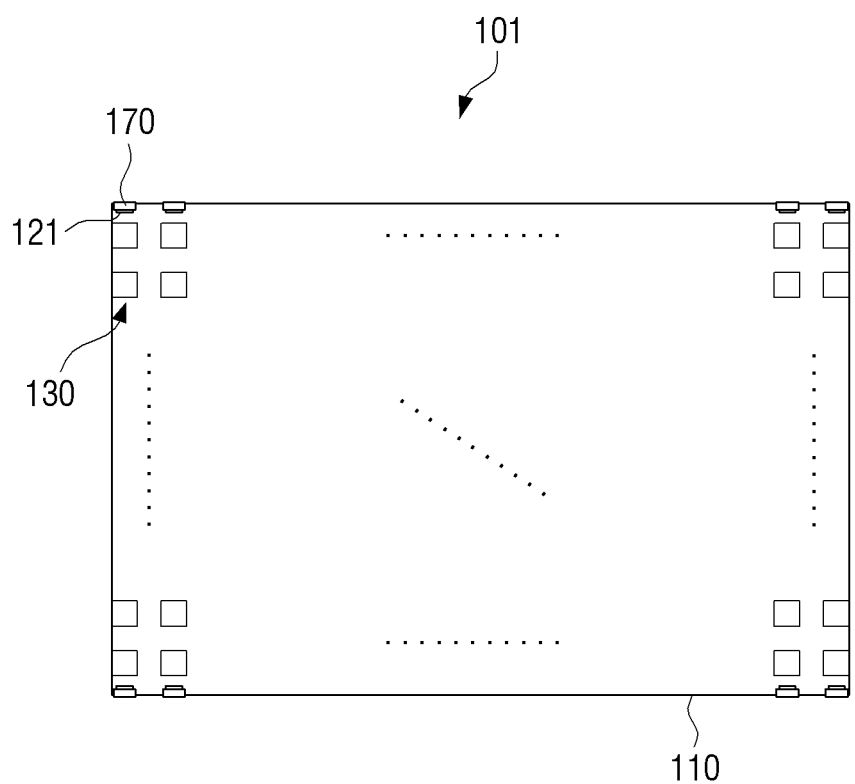
FIG. 9A is a front view illustrating a display panel according to another embodiment of the disclosure.
Figure 9B:
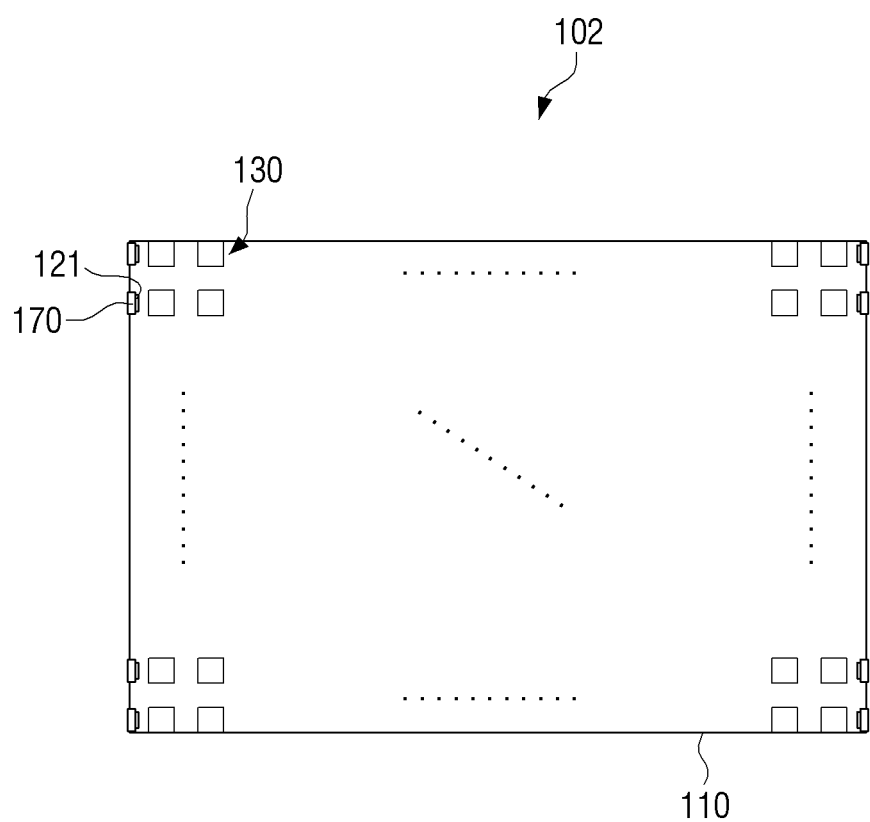
FIG. 9B is a front view illustrating a display panel according to yet another embodiment of the disclosure.

Referring to FIGS. 9A, 9B and 9C, display panels 101, 102 and 103 according to another embodiment of the disclosure will be described.

FIG. 9A is a front view illustrating a display panel according to another embodiment of the disclosure, FIG. 9B is a front view illustrating a display panel according to yet another embodiment of the disclosure, and FIG. 9C is a front view illustrating a display panel according to yet another embodiment of the disclosure.

The plurality of side wirings 170 may be formed on two sides or more among four sides of the TFT substrate 110, and the two sides on which the plurality of side wirings 170 are formed may be different.

For example, on one of the four sides of the TFT substrate 110, the first connection pad 121 and the second connection pad 123 for receiving a signal of the first driver 131 may be disposed, and on other one of the four sides of the TFT substrate 110, the first connection pad 121 and the second connection pad 123 for receiving a signal of the second driver 153 may be disposed.

In other words, in order to drive the plurality of pixels 130, on one of the four sides of the TFT substrate 110, the side wiring 170 for transmitting a gate signal may be formed, and on the other one of the four sides of the TFT substrate 110, the side wiring 170 for transmitting a data signal may be disposed.

For example, referring to FIG. 9A, the plurality of side wirings 170 and the first connection pad 121 and the second connection pad 123 connected by the plurality of side wirings 170 may be formed on an upper side or a lower side of the TFT substrate 110.

Referring to FIG. 9B, the plurality of side wirings 170 and the first connection pad 121 and the second connection pad 123 connected by the plurality of side wirings 170 may be formed on a left side or a right side of the TFT substrate 110.

Referring to FIG. 9C, unlike the TFT substrate 110 of the display panel 100 in a rectangular shape shown in FIG. 1A, a TFT substrate 110' included in a display module 103 may have a square shape.

For example, lengths of four sides of the TFT substrate 110' may be the same. To be specific, a third length L3 of the upper side and a fourth length L4 of the left side may be the same.

Accordingly, by way of arranging the TFT substrate 110' of the display module 103 in a square shape sequentially, it is possible to embody high luminance, and high color tone display screen of various sizes.

Figure 10:
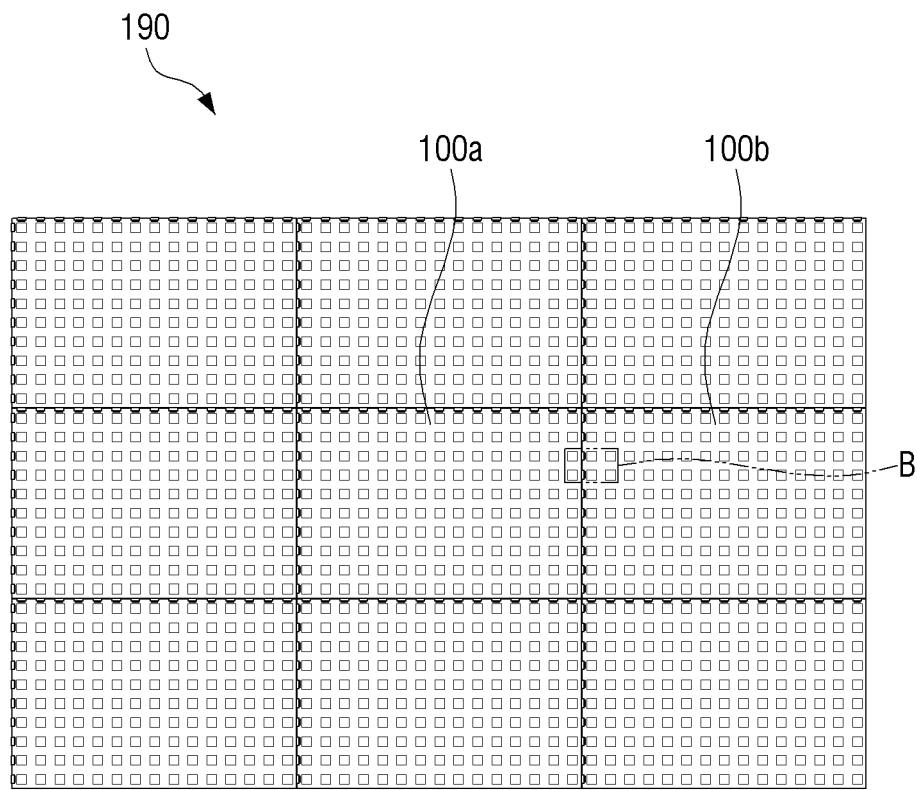
FIG. 10 is a front view illustrating a large format display apparatus formed by connecting a plurality of display panels according to an embodiment.
Figure 11:
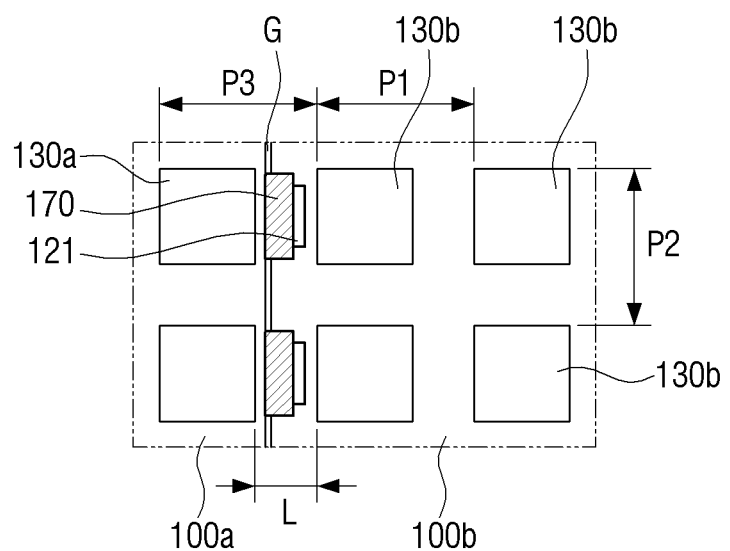
FIG. 11 is an enlarged view illustrating part B shown in FIG. 10 according to an embodiment.

FIG. 10 is a front view illustrating a large format display apparatus formed by connecting a plurality of display panels according to an embodiment, and FIG. 11 is an enlarged view illustrating part B shown in FIG. 10.

Referring to FIG. 10, a large format display apparatus 190 may be formed by connecting a plurality of bezel-less display panels 100 according to an embodiment.

Referring to FIG. 11, pixels of first and second display panels 100a and 100b, disposed adjacent to each other, may be disposed at the same pitch P1, P2, and P3. To be specific, the pitch P3 of the pixel 130a of the first display panel 100a and the pixel 130b of the second display panel 100b adjacent to the first display panel 100a may be the same as the pitches P1 and P2 of the pixels 130b of the second display panel 100b.

In order to render the pitches of the pixels of each display panel to be equal to the pitch of each of the pixels 130a and 130b of the first and second display panels 100a and 100b, a distance (L) between one end of the pixel 130a of the first display panel 100a and one end of the pixel of the second display panel 100b may be adjusted appropriately.

A predetermined gap (G) may be formed between the first and second display panels 100a and 100b adjacent to each other due to the thickness of the connection member, and yet, each pixel may have the same pitch. Because the predetermined gap (G) is minuscule compared to the size of the large format display apparatus 190, it is difficult to see the seam with naked eyes due to the gap (G) in the connection part of display panels when viewing an image displayed on the large format display apparatus 190. Therefore, the large format display apparatus 190 formed by connecting a plurality of bezel-less display panels 100 may be embodied as a single display panel.

It is described that a plurality of side wirings 170 are formed on the upper side and the left side of the TFT substrate 110 as shown in FIG. 1, but is not limited thereto. The plurality of side wirings 170 may be formed on one or more sides out of four sides of the TFT substrate 110.

For example, the plurality of side wirings 170 may be formed on the upper side or the lower side of the TFT substrate 110, formed on the upper side and the right side of the TFT substrate 110, or formed on the left side and the right side of the TFT substrate 110. The plurality of side wirings 170 may be formed on any one side out of four sides of the TFT substrate 110, or on three sides out of four sides of the TFT substrate 110.

Figure 12:
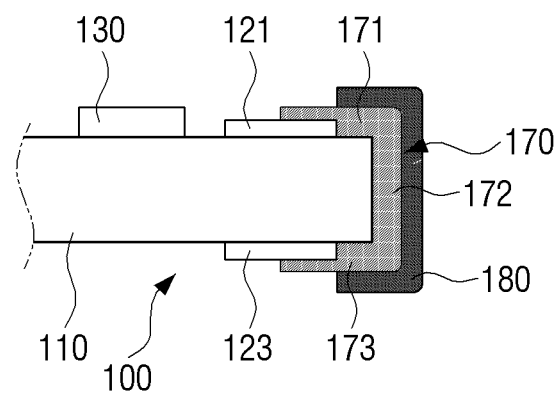
FIG. 12 is a cross-sectional view illustrating a protective layer stacked on a side wiring to protect a side wiring formed on the edge of the TFT substrate according to an embodiment.

FIG. 12 is a cross-sectional view illustrating a protective layer staked on a side wiring to protect a side wiring formed on the edge of the TFT substrate.

In addition, when a large format display apparatus is manufactured by connecting a plurality of display panels, and the plurality of side wirings 170 may be formed on one or more sides out of four sides of the TFT substrate 110, the side wirings of the display panels adjacent to each other may be shorted according to the forming positions of the plurality of side wirings. For example, when the plurality of side wirings connect a plurality of display panels formed on the upper side and the lower side of the TFT substrate 110, the side wirings of the display panels adjacent to each other in the vertical direction may be shorted.

To prevent the shortening phenomenon, referring to FIG. 12, it may be preferable to form a protective layer 180 that covers the plurality of side wirings 170. The protective layer 180 may perform an insulation function and a protection function to prevent the plurality of side wirings 170 being damaged due to the physical force and impact applied to the plurality of side wirings 170 from the outside.

Referring to FIG. 12, the protective layer 180 may fully cover the second part 172 of the side wiring 170, and partially cover part of the first and third parts 171 and 173, respectively, but it is not limited thereto, and it is possible cover the entire area of the first, second and third parts 171, 172 and 173. The protective layer 180 may be formed through various methods, such as an inkjet method, a stamping method, a deposition method, etc. for forming the side wiring 170 referring to FIGS. 15, 16, 17 and 18.

Figure 13:
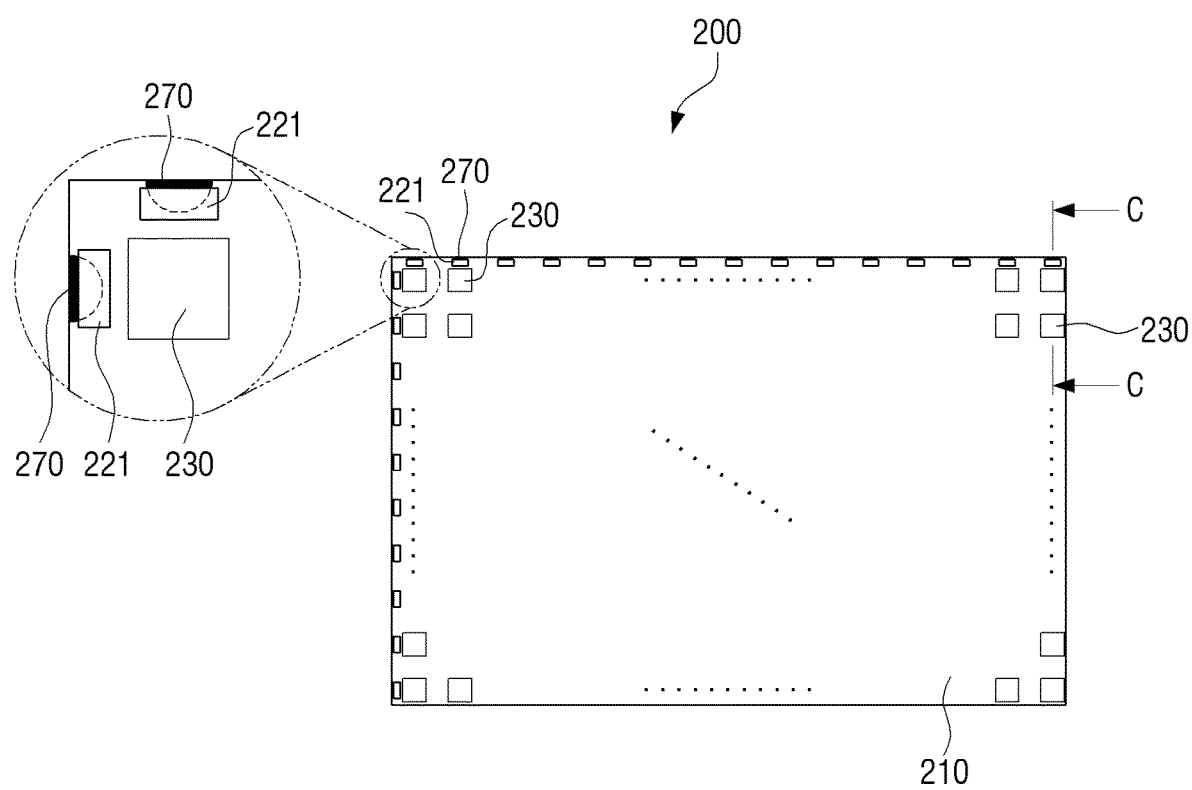
FIG. 13 is a front view illustrating a display panel according to another embodiment.
Figure 14:
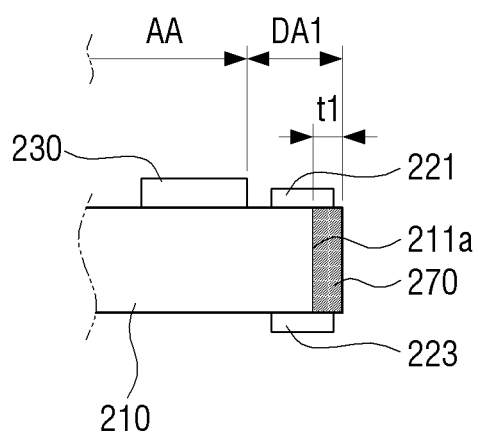
FIG. 14 is a cross-sectional view taken along line C-C shown in FIG. 13 according to an embodiment.

Referring to FIG. 13 and FIG. 14, the structure of the display panel 200 will be described. In describing the display panel 200, the description of components same as the display panel 100 will be omitted, and different embodiments of the side wiring 170 will be described.

FIG. 13 is a front view illustrating a display panel according to another embodiment, and FIG. 14 is a cross-sectional view taken along line C-C shown in FIG. 13.

Referring to FIG. 13, in a display panel 200, a plurality of pixels 230 may be formed in a matrix formation on a front surface of a TFT substrate 210, and a plurality of side wirings 270 may be formed at the edge of the TFT substrate 210.

The side wiring 270 may have substantially the same thickness as the side end surface of TFT substrate 210 from the inner side so that the side wiring 270 does not protrude from the side end surface of the TFT substrate 210.

Referring to FIG. 14, a groove 211a where the side wiring 270 is formed may be provided on the side end surface of the TFT substrate 210 so that the side wiring 270 may not protrude from the side end surface of the TFT substrate 210. In this case, the first and second connection pads 221, and 223 electrically connected to the side wiring 270 may be formed on the front surface or the back surface of the TFT substrate 210.

The first and second connection pads 221 and 223 may be formed at the edge of the TFT substrate 210 to cover both ends of the side wiring 270 after the side wiring 270 is formed on the TFT substrate 210 for enabling electric connection with the side wirings 270.

The side wiring 270 may not protrude from the side end surface of the TFT substrate 210, and thus the side wiring 270 may be prevented from being disconnected while the TFT substrate 210 is carried or handled.

A display panel 200 according to another embodiment of the disclosure, the side wiring 270 may be inserted into the groove 211a, and by directly connecting a first connection pad 221 and a second connection pad 233, a dummy area DA1 of the TFT substrate 210 may be smaller than a dummy area DA of the TFT substrate 110 as shown in FIG. 2.

A process for forming the side wiring 270 at the edge of the TFT substrate 210 will be shown in FIG. 15 to FIG. 18 in a sequential manner. However, the process of forming the side wiring 270 is not limited thereto.

FIGS. 15, 16, 17 and 18 are views sequentially illustrating a manufacturing process of a display panel according to another embodiment.

Figure 15:
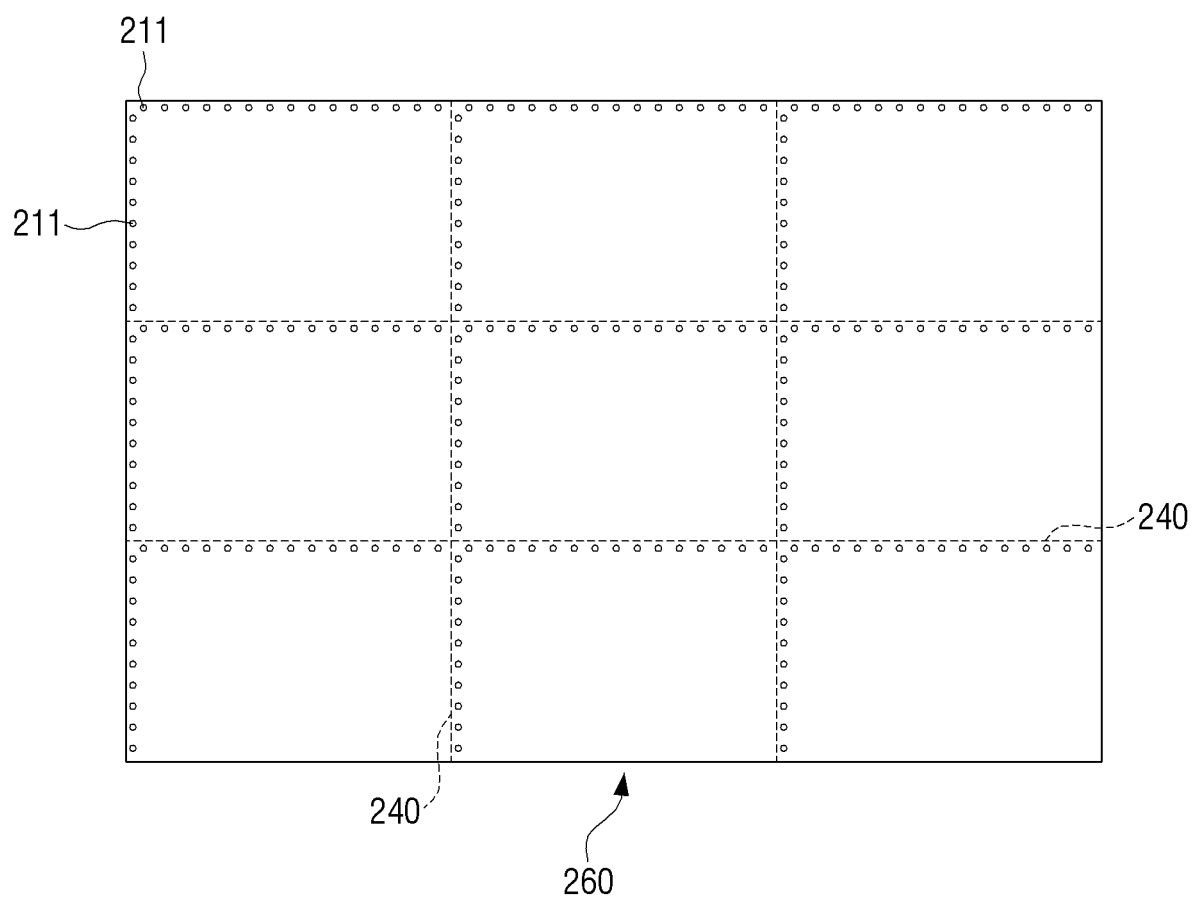
FIGS. 15, 16, 17, and 18 are views sequentially illustrating a manufacturing process of a display panel according to an embodiment.

Referring to FIG. 15, a large-sized glass 260 that enables manufacturing a plurality of TFT substrates may be provided.

The glass 260 may function as a TFT substrate because transistors, gate signal lines, data signal liens, etc., may be formed by a Lithography process in a plurality of virtually divided areas.

A plurality of holes 211 may be manufactured to correspond to the plurality of virtually divided areas.

Figure 16:
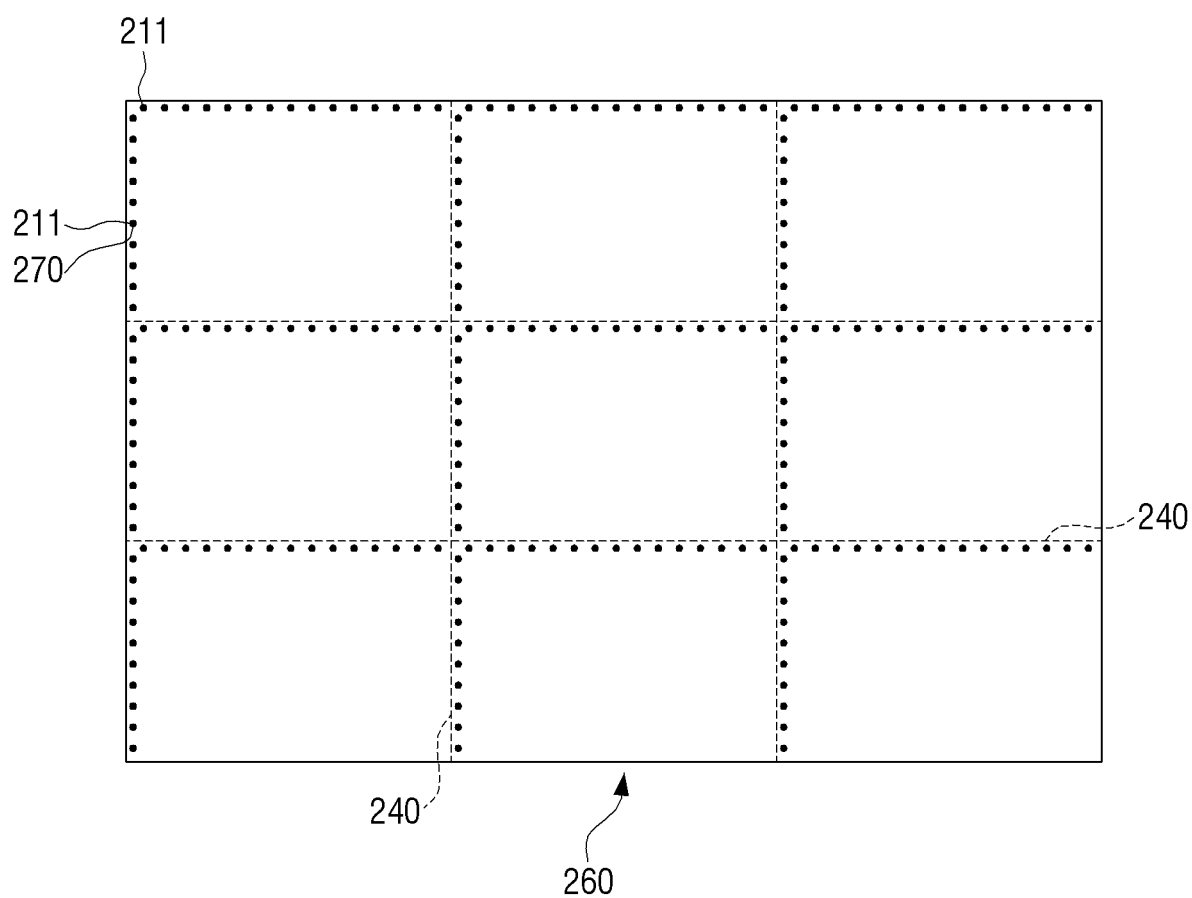

Referring to FIG. 16, a conductive metal material may be applied to each of the plurality of holes 211. The conductive metal material may completely fill each of the plurality of holes 211.

After all the conductive metal materials are applied to the plurality of holes 211, a plurality of spare TFT substrates 261 may be formed along a virtual first cutting line 240 of the glass 260.

Figure 17:
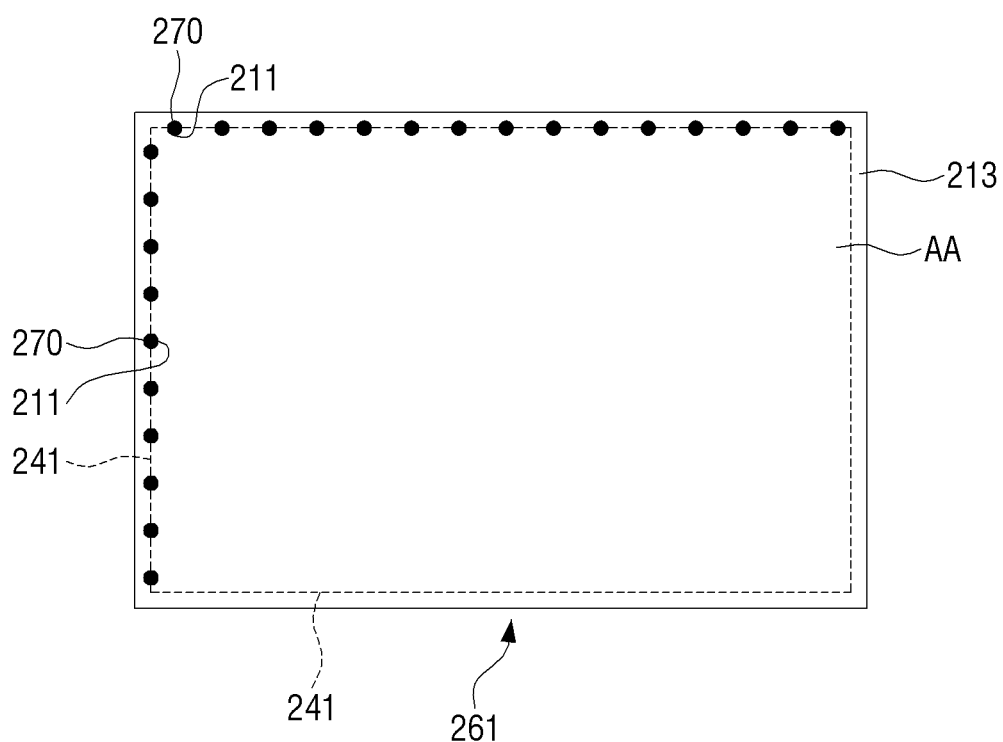

Referring to FIG. 17, the edge of each spare TFT substrate 261 may be secondarily cut along a virtual second cutting line 241. A part of the second cutting line 241 may be set to cross the center of each hole 211. Therefore, the second cutting may be performed more accurately than the first cutting because a ultra-mini sized hole 211 may be cut into half by the second cutting.

Figure 18:
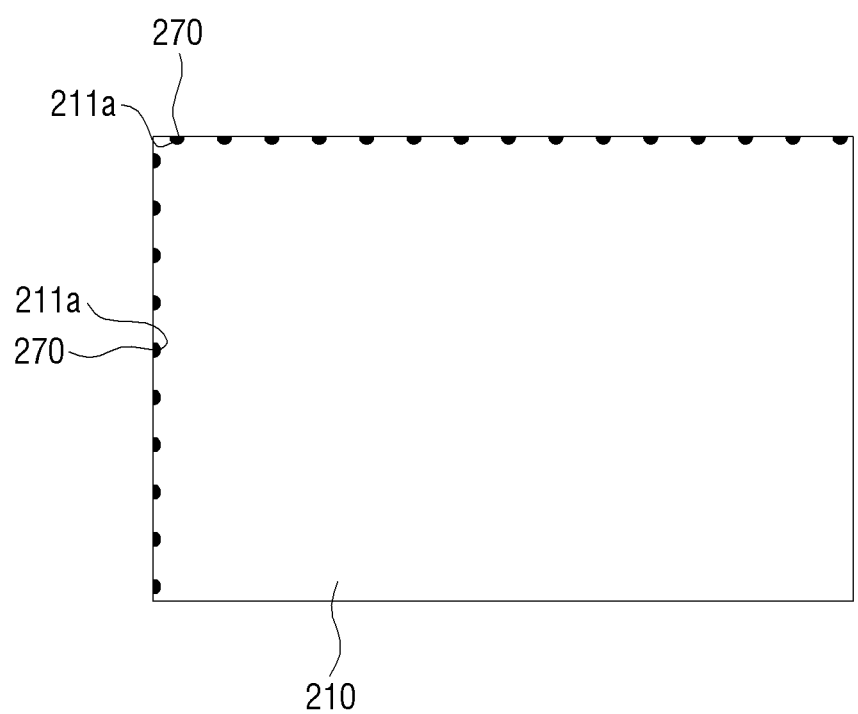

Referring to FIG. 18, the hole 211 may be formed in a semi-circular groove 211a by the second cutting. Therefore, a plurality of μ-LEDs may be mounted on the TFT substrate 210 through various processes, such as a transfer technique, etc.

Figure 19:
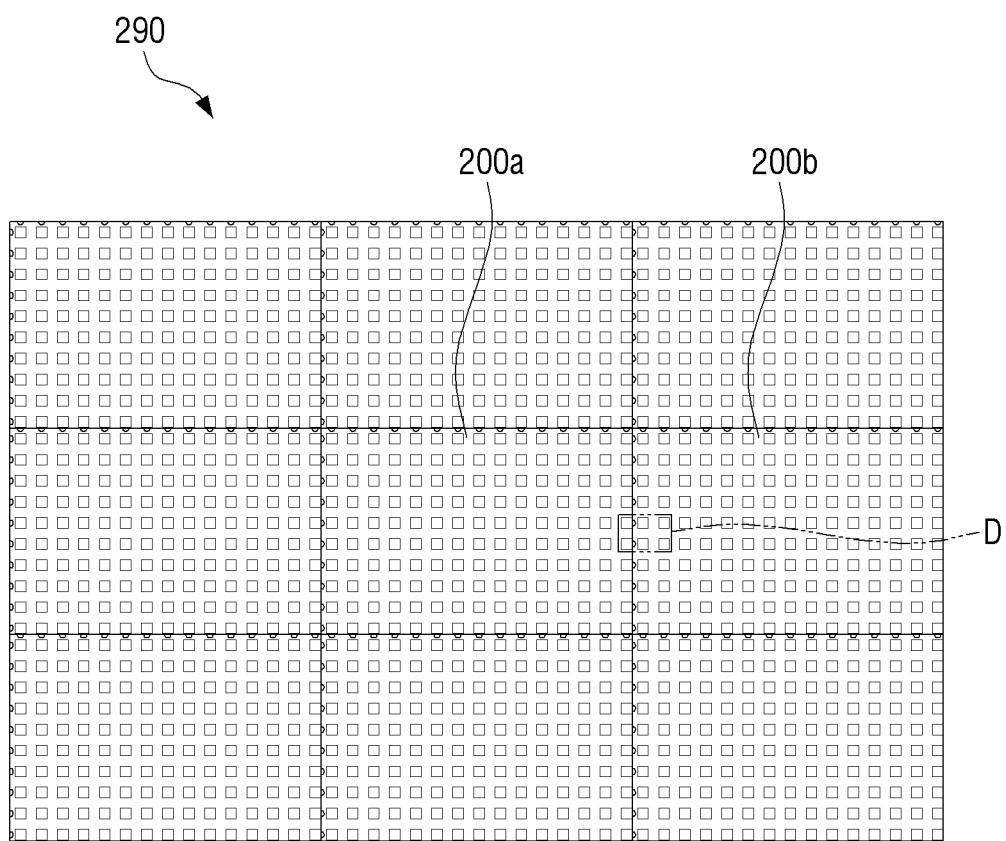
FIG. 19 is a front view illustrating a large format display apparatus formed by connecting a plurality of display panels according to another embodiment.
Figure 20:
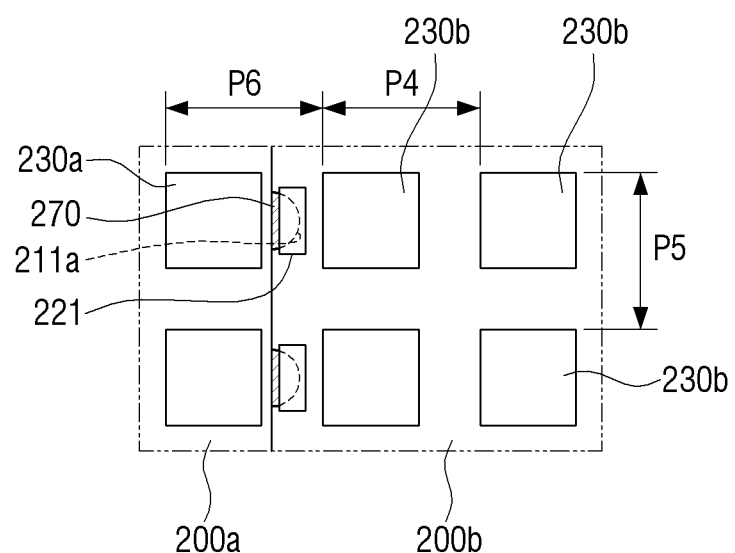
FIG. 20 is an enlarged view illustrating part D shown in FIG. 19 according to an embodiment.

FIG. 19 is a front view illustrating a large format display apparatus formed by connecting a plurality of display panels according to another embodiment, and FIG. 20 is an enlarged view illustrating part D shown in FIG. 19.

Referring to FIG. 19, the large format display apparatus 290 may be formed by connecting the plurality of display panels 200a and 200b, for example. The large format display apparatus 290 may be formed at the edge of the TFT substrate so that the plurality of side wirings 270 may not protrude from the side end surface of the TFT substrate. Referring to FIG. 20, the gap G between the display panels 200a and 200b adjacent to each other may be removed by forming the plurality side wirings 270 so that they do not protrude from the side end surface of the TFT substrate.

Figure 21:
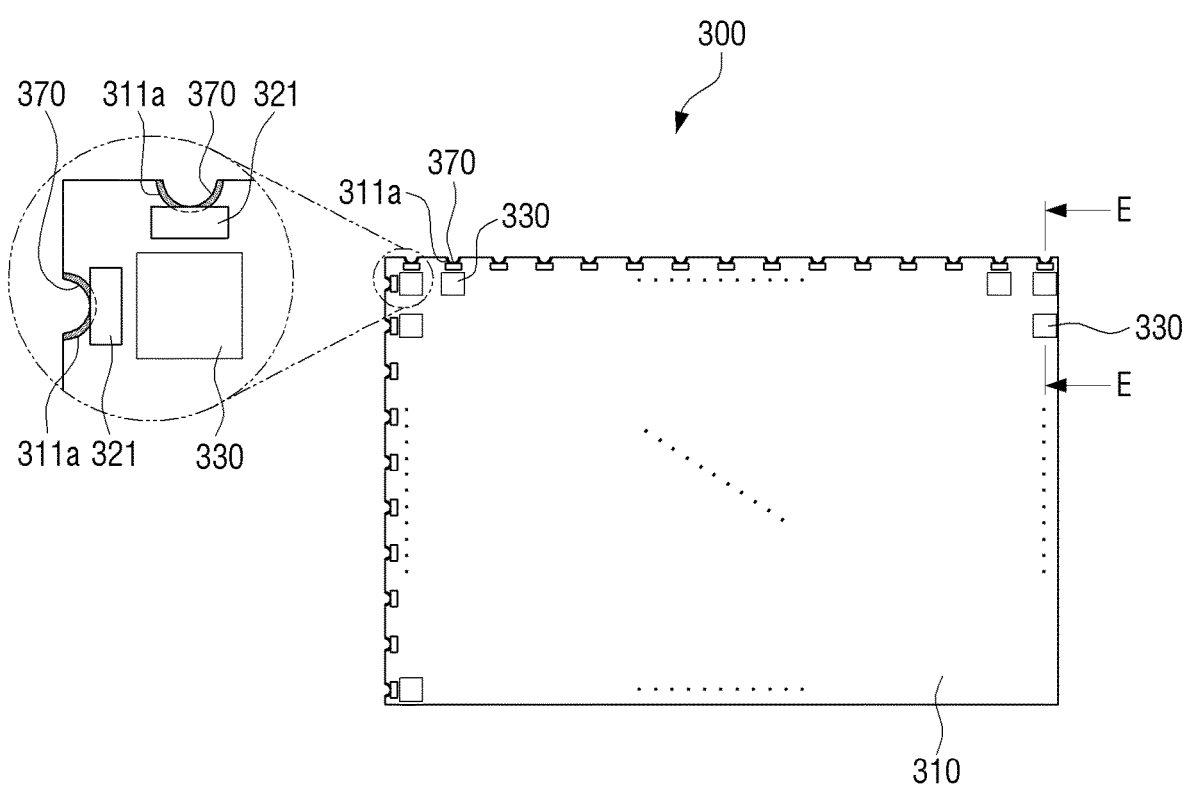
FIG. 21 is a front view illustrating a display panel according to yet another embodiment.
Figure 22:
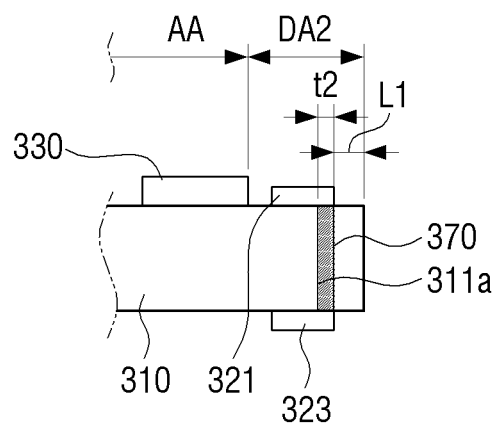
FIG. 22 is a cross-sectional view taken along line E-E shown in FIG. 21.

FIG. 21 is a front view illustrating a display panel according to yet another embodiment, and FIG. 22 is a cross-sectional view taken along line E-E shown in FIG. 21.

Referring to FIG. 21, a display panel 300 according to yet another embodiment may have the same structure as the display panel 200 according to another embodiment of the disclosure, but the thickness and the shape of a side wiring 370 may be differently formed.

The side wiring 370 may be applied to have a predetermined thickness in the inner circumferential surface of a groove 311a of the display panel 300. In order to form the side wiring 370, a conductive metal material may be applied to the inner circumferential surface of each hole to have a predetermined thickness not to fill the hole 211 of the glass 260 completely (see FIG. 15), and the second cutting may be performed.

Accordingly, the side wiring 370 may be formed to have an approximate arc shape as shown in FIG. 21, and the surface of the part of the side wiring 370 may be disposed inwardly from the side end surface of TFT substrate 310 as shown in FIG. 22.

Referring to FIG. 22, a first connection pad 321 and a second connection pad 323 may be electrically connected to each end of the side wiring 370 at the front surface and the back surface of the edge of the TFT substrate 310. It is illustrated that the part of the first and second connection pads 321 and 323 are connected to the part of the both ends of the side wiring 370 as shown in FIG. 21, but it is not limited thereto. The first and second connection pads 321 and 323 may be in contact with the both ends of the wire 370 in a large cross-sectional area. The first and second connection pads 321 and 323 may be formed to be closer to the side end surface of the TFT substrate 310 compared to the positons shown in FIG. 21.

In the display panel 300 according to yet another embodiment, a dummy area DA2 of the TFT substrate 310 may have a reduced area than the dummy area DA of the TFT substrate 110, and thus the active area AA of the TFT substrate 110 may be increased.

It is described that, in the display panels 200 and 300, the plurality of side wirings 270 and 370 are formed on the upper and the left side of the TFT substrate 210 and 320, as shown in FIG. 13 and FIG. 21, but is not limited thereto. The plurality of side wirings 270 and 370 may be formed on one or more sides out of four sides of the TFT substrates 210 and 310.

When a large format display apparatus is manufactured by connecting a plurality of display panels, a protective layer for covering the plurality of side wirings 270 and 370 may be formed. Accordingly, the plurality of side wirings 270 and 370 may be protected from being shorted, which may occur between the plurality of side wirings 270 and 370 of the adjacent display panels due to physical force and impact applied to the plurality of side wirings 270 and 370 from the outside.

According to various embodiments of the disclosure, wires for electrically connecting a front surface and a back surface of the TFT substrate may be formed at the edge of the TFT substrate to minimize the dummy area of the TFT substrate. Therefore, a bezel-less display panel may efficiently utilize the areas of the display panel.

When a large format display apparatus is formed by connecting a plurality of bezel-less display panels, the seam may not appear on the part where display panels are connected, and thus the display quality may be improved.

Each of the components (e.g., modules or programs) according to various embodiments may include a single entity or a plurality of entities, and some subcomponents of the abovementioned subcomponents may be omitted, or other components may be further included in various embodiments. Alternatively or additionally, some components may be integrated into one entity to perform the same or similar functions performed by each component prior to integration. Operations performed by modules, programs, or other components, in accordance with various embodiments, may be executed sequentially, in parallel, repetitively, or heuristically, or at least some operations may be performed in a different order, or omitted, or another function may be further added.

Although embodiments have been shown and described, it will be appreciated by those skilled in the art that changes may be made to these embodiments without departing from the principles and spirit of the disclosure. Accordingly, the scope of the disclosure may not be construed as being limited to the described embodiments.

What is claimed is:

1. A display panel, comprising:
   a thin film transistor glass substrate;
   a plurality of micro light emitting diodes (LEDs) arranged on one surface of the thin film transistor glass substrate; and
   a plurality of side wirings formed at an edge of the thin film transistor glass substrate to electrically connect the one surface of the thin film transistor glass substrate to an opposite surface to the one surface,
   wherein each of the plurality of side wirings is connected to the one surface, a side end surface, and the opposite surface to the one surface of the thin film transistor glass substrate,
   wherein both ends of each of the plurality of side wirings are electrically connected to a first connection pad and a second connection pad formed at the edge of the thin film transistor glass substrate, respectively,
   wherein the second connection pad is directly disposed on the opposite surface of the thin film transistor glass substrate, and
   wherein both ends of each side wiring cover the first connection pad and the second connection pad.

2. The display panel as claimed in claim 1, wherein the edge of the thin film transistor glass substrate corresponds to a dummy area not including an active area where the plurality of micro LEDs are arranged on the thin film transistor glass substrate.

3. The display panel as claimed in claim 2, wherein the edge of the thin film transistor glass substrate is an area from an outermost portion of the thin film transistor glass substrate to the active area.

4. The display panel as claimed in claim 1, wherein the plurality of side wirings are formed on a side end surface of the thin film transistor glass substrate at a predetermined interval.

5. The display panel as claimed in claim 4, wherein the plurality of side wirings are disposed on a plurality of grooves formed on the side end surface of the thin film transistor glass substrate.

6. The display panel as claimed in claim 1, wherein the plurality of side wirings are disposed on a side end surface of the thin film transistor glass substrate.

7. The display panel as claimed in claim 5, wherein the plurality of side wirings are formed inwardly from the side end surface of the thin film transistor glass substrate.

8. The display panel as claimed in claim 1, wherein a protective layer for covering the plurality of side wirings is formed at the edge of the thin film transistor glass substrate.

9. The display panel as claimed in claim 8, wherein the protective layer is formed of an insulating material.

10. The display panel as claimed in claim 6, wherein the plurality of side wirings is formed on the side end surface of the thin film transistor glass substrate so that the plurality of side wirings does not protrude from the side end surface of the thin film transistor glass substrate.

11. The display panel as claimed in claim 1, wherein the first connection pad and the second connection pad are formed closer to a side end surface of the thin film transistor glass substrate.

12. A large format display apparatus manufactured by connecting a plurality of display panels, wherein each of the plurality of display panels comprises:
   a thin film transistor glass substrate;
   a plurality of micro light emitting diodes (LEDs) arranged on one surface of the thin film transistor glass substrate; and
   a plurality of side wirings formed at an edge of the thin film transistor glass substrate to electrically connect the one surface of the thin film transistor glass substrate to an opposite surface to the one surface,
   wherein three micro LEDs constitute one pixel,
   wherein a plurality of pixels provided in each of the plurality of display panels are arranged at a first pitch,
   wherein pixels of adjacent display panels among pixels of the plurality of display panels are arranged at a second pitch that is equal to the first pitch,
   wherein each of the plurality of side wirings is connected to the one surface, a side end surface, and the opposite surface to the one surface of the thin film transistor glass substrate,
   wherein both ends of each of the plurality of side wirings are electrically connected to a first connection pad and a second connection pad formed at the edge of the thin film transistor glass substrate, respectively,
   wherein the second connection pad is directly disposed on the opposite surface of the thin film transistor glass substrate, and wherein both ends of each side wiring cover the first connection pad and the second connection pad.

* * * * *